United States Patent [19]

Motoyama

[11] Patent Number: 5,160,404
[45] Date of Patent: Nov. 3, 1992

[54] METHOD OF REMOVING A PATTERNED MULTILEVEL RESIST FROM A SURFACE LAYER ON A SUBSTRATE

[75] Inventor: Takushi Motoyama, Kawasaki, Japan

[73] Assignee: Fujitsu Limited, Kawasaki, Japan

[21] Appl. No.: 622,597

[22] Filed: Dec. 5, 1990

[30] Foreign Application Priority Data

Dec. 5, 1989 [JP] Japan .................................. 1-315712

[51] Int. Cl.$^5$ .................. B44C 1/22; C03C 15/00; C03C 25/06; B29C 37/00
[52] U.S. Cl. .................................. 156/643; 156/651; 156/653; 156/657; 156/661.1; 156/663; 156/668; 430/329
[58] Field of Search ............... 156/643, 646, 650, 651, 156/657, 655, 656, 661.1, 662, 668, 652, 653, 659.1, 663; 204/192.32, 192.36, 192.37; 252/79.1; 430/329, 296

[56] References Cited

U.S. PATENT DOCUMENTS

| | | |
|---|---|---|
| 4,789,427 | 12/1988 | Fujimura et al. .................. 156/643 |
| 4,861,424 | 8/1989 | Fujimura et al. .................. 156/643 |
| 4,976,818 | 12/1990 | Hashimoto et al. .............. 156/643 |

*Primary Examiner*—William A. Powell
*Attorney, Agent, or Firm*—Staas & Halsey

[57] ABSTRACT

A method for removing a patterned multilevel resist formed on a substrate where layer of a substrate, the multilevel resist has a lower resist layer and an upper resist layer formed on the lower resist layer, and where the upper resist layer contains silicon atoms. The method includes forming a resin layer on the lower resist layer and on a surface exposed from the patterned multilevel resist, and etching the resin layer and the patterned multilevel resist by a first dry etching process using halogen containing gas until the upper resist layer is removed. The resin layer and the multilevel resist, which have remained after the first dry etching process, are etched by a second dry etching process using oxygen containing gas.

15 Claims, 2 Drawing Sheets

METHOD OF REMOVING A PATTERNED MULTILEVEL RESIST FROM A SURFACE LAYER ON A SUBSTRATE

BACKGROUND OF THE INVENTION

1. Field of the Invention

The invention relates to a method of fabricating semiconductor devices, and more particularly to a method of removing a patterned multilevel resist. The invention is applicable to a method of fabricating semiconductor devices, which has a substrate reproduction process in which, prior to etching a substrate such as a silicon (Si) substrate by using as a mask a resist pattern formed by a multilevel resist method, the resist pattern on the substrate is removed and the substrate is reproduced. The invention especially relates to a method of fabricating semiconductor devices which is capable of reproducing a substrate without substantially causing damage to the substrate surface in removing a multilevel resist from the substrate.

2. Description of the Prior Art

With the reduction in the size of large-scale integrated circuits in recent years, multilevel resist methods are being developed extensively, so that very fine resist patterns can be formed with high fidelity. As the multilevel resist methods are advanced, there is a strong and growing demand for a method of reproducing a substrate in a case where patterning defects arise in a resist pattern formed by the multilevel resist method. That is, if the pattern width or shape of the finished resist pattern is shifted from a design tolerance, it is necessary that the defective resist pattern on the substrate be removed for reproducing the substrate and that a resist pattern be formed once again on the reproduced substrate. A method of fabricating semiconductor devices is therefore required which has a substrate reproduction process in which a silicon containing layer used in the multilevel resist on a substrate can be removed reliably and at the same time the exposed portion of the substrate can be prevented from being etched.

In a conventional method of patterning a resin on a substrate, as a resist, there is used a single-layer positive resist of novolak resin that is heated at a low temperature of the order of 100° C. prior to exposure. The reproduction of the substrate is easily performed by dissolving and removing the single-layer resist with organic solvent such as ketones and esters. The shape of the patterned single-layer resist is observed to inspect if it is within a design tolerance, and if patterning defects occur, the single-layer resist will be removed from the substrate with organic solvent. A single-layer resist is deposited once again on that substrate and patterned. If a single-layer resist is patterned within a design tolerance, it will be used as a mask for etching in the next etching process.

However, the above described conventional substrate reproduction method using organic solvent cannot be applied to the resist pattern formed by the multilevel resist method This is because the novolak resin of the underlying resist is heated at a high temperature on the order of 200° C. and becomes insoluble in organic solvent in order to avoid intermixing with the upper layer to be coated on the underlying resist. For example, for a trilevel resist (a multilevel resist consisting of three layers), the underlying resist of novolak resin is heated at the temperature of the order of 200° C., and the intervening layer containing silicon such as SOG (spin on glass) is coated on the underlying resist and heated. The top layer resist of novolak resin, which is coated on the intervening layer, is patterned by exposure and development, the intervening layer is patterned with the top layer pattern as a mask by RIE (reactive ion etching), and finally the underlying resist is etched by $O_2$ RIE. For a two-level resist (a multilevel resist consisting of two layers), the underlying resist of novolak resin is heated at a temperature on the order of 200° C., and the top layer resist having silicon such as polymethylsilsesquioxane (PMSS) (an electron beam negative resist), which is coated on the underlying resist, is patterned by exposure and development. Finally, the underlying resist is etched by $O_2$ RIE.

If there are defects in the multilevel resist pattern, the reproduction of the substrate must be performed. In that case, in order to remove the defective multilevel resist pattern, which contains the underlying layer insoluble in organic solvent, a method similar to a resist ashing process is applied. Since the silicon containing layer must be also removed, an etching process using a plasma containing oxygen and a chemical substance having halogen as an element (for example $CF_4$) or an etching process consisting of sequential stages using a plasma containing the chemical substance having halogen and using $O_2$ plasma is adopted. However, when the surface of the substrate comprises silicon oxide, phosphosilicate glass (PSG), borophosphosilicate glass (BPSG), silicon nitride, polycrystal silicon, monocrystal silicon, tungsten, tungsten silicide or the like, the substrate is also etched during the removal of the multilevel resist because the plasma containing halogen etched the surface of the substrate. This often causes serious troubles in device fabrication on the reproduced substrate.

It is therefore an object of the present invention to provide a novel method of fabricating a semiconductor device which is capable of reproducing a substrate by removing a multilevel resist without etching the underlying substrate.

SUMMARY OF THE INVENTION

In accordance with an important aspect of the present invention, there is provided a method for removing a patterned multilevel resist formed on a substrate layer of a substrate, the multilevel resist having a lower resist layer and an upper resist layer formed on the lower resist layer, the upper resist layer containing silicon atoms, comprising the steps of (a) forming a resin layer on the lower resist layer and on a surface exposed from the patterned multilevel resist, (b) etching the resin layer and the patterned multilevel resist by a first dry etching process using halogen containing gas until the upper resist layer is removed, and (c) etching the resin layer and the multilevel resist, which have remained after the first dry etching process, by a second dry etching process using oxygen containing gas.

In the present invention, as shown in FIGS. 1(a)–1(g), a silicon containing layer 14 is patterned as a mask for etching of a resist layer 13, the resist layer 13 is etched, and a surface layer 12 on a substrate 11 is exposed. A resin layer 18 is then applied so that the substrate surface layer 12, the resist layer 13 and the silicon containing layer 14 are completely covered. After the silicon containing layer 14, a part of the resist layer 13 and a part of the resin layer 18 have been etched by a plasma containing a chemical substance having halogen as an element (for example, CH₄), the remaining resin layer 18 and the resist layer 13 are removed by a plasma containing $O_2$ so that the substrate can be reproduced without etching the substrate 11. Instead of the $O_2$ plasma, a downstream of $O_2$ plasma can also be used which is defined as neutral gas flowing down from the plasma and containing neutral radicals but no ions and electrons.

Since the silicon containing layer 14 is etched by a plasma containing a chemical substance having halogen as an element (for example, CH₄), the silicon containing layer 14 can be etched easily. In addition, since the substrate surface layer 12 is completely protected by the resin layer 18, the silicon containing layer 14 can be etched without etching the substrate 11. Note that the resin layer 18 is required to have a thickness such that after removal of the entire silicon containing layer 14 a part of the resin layer 18 will remain over the substrate surface layer 12. In addition, since the lower resist layer 13 and the resin layer 18 are etched by a plasma containing oxygen (no halogen such as fluorine atom is contained), the substrate 11 can be reproduced without being etched.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

Figure 1A:
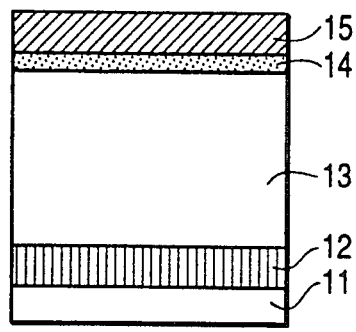
FIGS. 1(a), 1(b), 1(c), 1(d), 1(e), 1(f) and 1(g), and 2(a), 2(b), 2(c), 1(d), 2(e) and 2(f) are cross sectional views, partly broken away, representing the essential steps in a preferred method of carrying out the present invention.

Referring to FIGS. 1(a)–1(g) and 2(a)–2(f), there is shown a preferred embodiment of a method of fabricating a semiconductor device according to the present invention.

In the figures, reference numerals 11 and 21 denote a substrate (for example, a silicon (Si) substrate), 12 and 22 a surface layer of the substrate (for example, a phosphosilicate glass (PSG)), 13 and 23 a resist layer (for example, a novolak positive resist), 14 a Si containing layer (for example, SOG (spin on glass)), 15 a mask layer, 24 a Si containing resist layer (for example, PMSS, an electron beam negative resist), 16 and 26 windows formed in the Si containing layers 14 and 24, respectively, 17 and 27 windows formed in the resist layer 13 and 23, respectively, and 18 and 28 a resin layer (for example, poly(methyl methacrylate), called PMMA).

A novolak positive resist is spin-coated on the substrate surface layer 12 to form the lower resist layer 13. A spin on glass (SOG) is spin-coated on the lower resist layer 13 to form the upper resist layer 14 containing silicon. After formation of the silicon containing layer 14, a novolak positive resist is spin-coated on the layer 14 to form the mask layer 15. The mask layer 15 is patterned by exposure and development and serves as a mask for etching of the silicon containing layer 14. The silicon containing layer 14 is then etched by anisotropic etching and the windows 16 are formed in the layer 14. Using the silicon containing layer 14 as a mask, the lower resist layer 13 is etched.

Figure 2A:
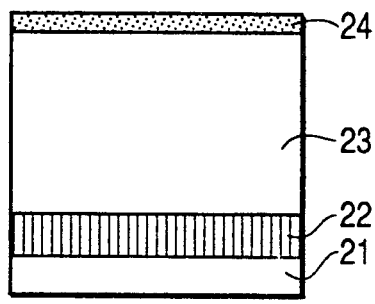

A novolak positive resist is applied on the substrate surface layer 22 to form the lower resist layer 23. A silicon containing resist (PMSS) is applied on the lower resist layer 23 to form the upper resist layer 24. The upper resist layer 24 is patterned by exposure and development and the windows 26 are formed in the layer 24. The silicon containing layer 24 is used as a mask for etching of the lower resist layer 23, and the lower resist layer 23 is etched and formed with the windows 27 through which the substrate surface layer 22 is exposed, as shown in FIG. 2(c).

The method of fabricating a semiconductor device according to the present invention will hereinafter be described for a multilevel resist, for example, a two-level resist layer consisting of an upper resist layer and a lower resist layer.

After the lower resist layers 13 and 23 have been etched, it is determined if the layers 13 and 23 are patterned within a design tolerance. If the pattern width of the lower resist layers 13 and 23 are not within the design tolerance, then a substrate reproduction process, which will hereinafter be described, is performed to remove the silicon containing layers 14 and 24 and lower resist layers 13 and 23, and a multilevel resist is formed once again on the substrates 13 and 23 from which the layers 13, 14, 23 and 24 were removed, and patterned in the same manner as described above. Note that when the pattern widths of the lower resist layers 13 and 23 are within the design tolerance, the substrate surface layers 12 and 22 are etched in the next process.

Figure 1E:
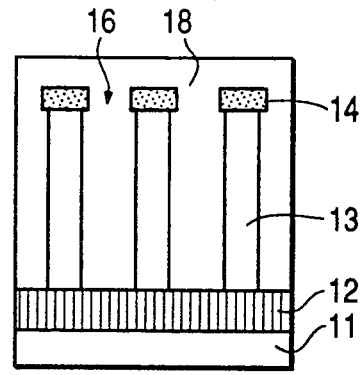
Figure 1B:
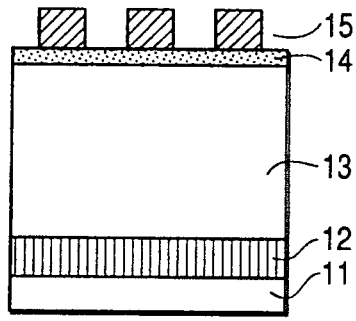
Figure 1F:
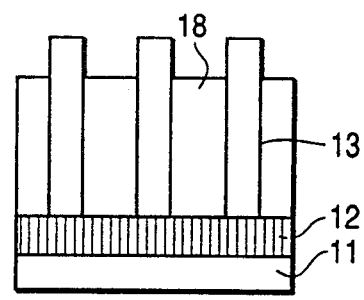
Figure 1C:
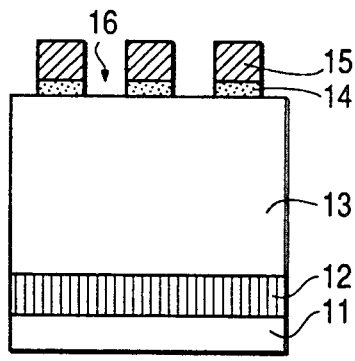
Figure 1G:
Figure 1D:
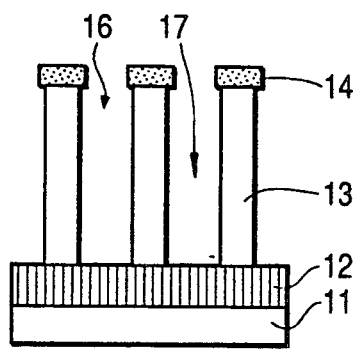
Figure 2D:
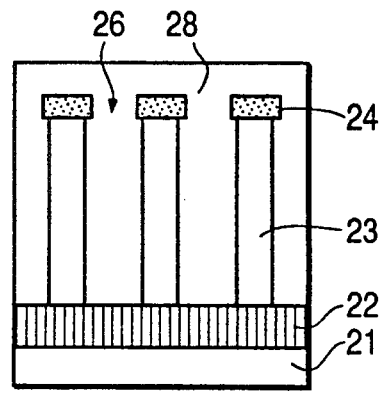
Figure 2B:
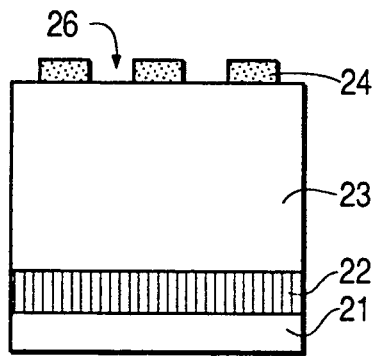
Figure 2E:
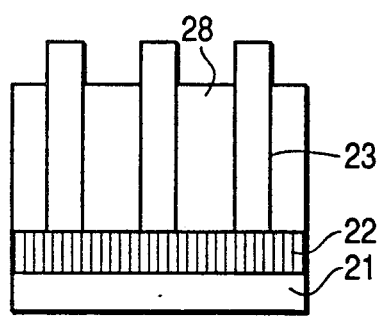
Figure 2C:
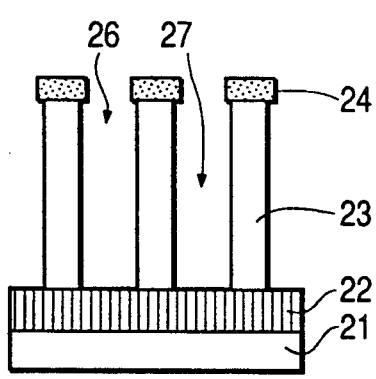
Figure 2F:
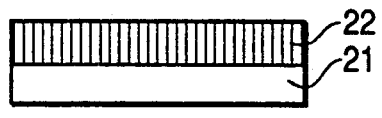

Next, in order to remove the defective lower resist layers 13 and 23, PMMA is applied on the substrate surface layers 12 and 22 to form the resin layers 18 and 28, as shown in FIGS. 1(e) and 2(d). The upper portions of the resin layers 18 and 28, the silicon containing layers 14 and 24 and the upper portions of the lower resist layers 13 and 23 are etched by RIE (reactive-ion etching) using mixtures of carbon tetrafluoride (CF₄) gas and oxygen (O₂) gas, as shown in FIGS. 1(f) and 2(e). The RIE is stopped at the point in time in which the substrate surface layers 12 and 22 are not exposed (all of the silicon containing layers 14 and 24 are removed). The reason why oxygen (O₂) gas is added to carbon tetrafluoride (CF₄) gas is that the etch rates of the resin layers 18 and 28 are enhanced. That is, the silicon containing layers 14 and 24 can be etched by carbon tetrafluoride (CF₄) gas, but the etch rates of the resin layers 18 and 28 become very slow if oxygen (O₂) gas is not added. Finally, the defective resist layers 13 and 23 and the resin layers 18 and 28 are etched by O₂ plasma.

That is to say, since in the above embodiment the silicon containing layers 14 and 24 are etched by a plasma containing fluorine atoms (F) composing carbon tetrafluoride (CF₄) gas, the silicon containing layers 14 and 24 can be etched easily. In addition, since the substrate surface layers 12 and 22 are completely protected by the resin layers 18 and 28, the silicon containing layers 14 and 24 can be etched without causing damage to the substrate surface layers 12 and 22. Note that the resin layers 18 and 28 are required to have a thickness such that after removal of the entire silicon containing layers 14 and 24 a part of the resin layer will remain over the substrate surface layers 12 and 22. In addition, since the lower resist layers 13 and 23 and the resin layers 18 and 28 are etched by a plasma containing oxygen (no halogen such as fluorine is contained), the substrates 11 and 21 can be reproduced so that the damage to the substrate surface layers 12 and 22 caused by a plasma etching using halogen such as fluorine will not arise.

As the chemical substance having halogen according to the present invention, there are $F_2$, $CF_4$, $CF_3$, $C_2F_6$, $Cl_2$, $CCl_4$, $Br_2$, $NF_3$, HBr, and the like.

While the subject invention has been described with relation to a method of removing a multilevel resist when the layer is defective, it is noted that it is also applicable to a method of removing a multilevel resist after it has been used as a mask and patterned. In addition to the construction of the multilevel resist described above, the upper resist layer 14 or 24 may also comprise a photosensitive organic material containing silicon, and two-level construction using no mask layer can also be used. Furthermore, the lower resist layer 13 or 23 is constituted by a novolak resin and etched to have a predetermined pattern by illuminating an energy beam (infrared light or excimer laser). While the patterned lower resist layer is heated within a reduced pressure chamber at a temperature of, for example, 100° C., the illuminated portion is silylized with sililation reagent (e.g. HMDS (hexamethyldisilazane)), and the upper resist layer 14 is formed. Using this method, a multilevel resist can also be formed.

Although the invention has been described with a certain degree of particularity, it is understood that the present disclosure has been made only by way of example and that numerous changes in the details of the construction and the combination and arrangement of parts may be made without departing from the scope of the invention as hereinafter claimed.

What is claimed is:

1. A method for removing a patterned multilevel resist formed on a substrate layer of a substrate, the multilevel resist having a lower resist layer and an upper resist layer formed on the lower resist layer, the upper resist layer containing silicon atoms, comprising the steps of:
    forming a resin layer on the lower resist layer and on a surface exposed from the patterned multilevel resist;
    etching said resin layer and the patterned multilevel resist by a first dry etching process using halogen containing gas until the upper resist layer is removed; and
    etching the resin layer and the multilevel resist, which have remained after said first dry etching process, by a second dry etching process using oxygen containing gas.

2. A method for removing a patterned multilevel resist according to claim 1, wherein said second dry etching process is a plasma etching process using oxygen containing gas.

3. A method for removing a patterned multilevel resist according to claim 1, wherein said second dry etching process is an etching process using a downstream of $O_2$ plasma, which is defined as neutral gas flowing down from the plasma and containing neutral radicals but no ions and electrons.

4. A method for removing a patterned multilevel resist according to claim 1, wherein the upper resist layer comprises an organic material containing silicon which can be patterned by an energy beam exposure process.

5. A method for removing a patterned multilevel resist according to claim 1, wherein the lower resist layer comprises an organic material and the upper resist layer comprises a selective silylized surface of the lower resist layer.

6. A method for removing a patterned multilevel resist according to claim 1, wherein the upper resist layer is patterned by an etching process using a mask that is formed on the upper resist layer.

7. A method for removing a patterned multilevel resist according to claim 6, wherein the upper resist layer comprises one of $SiO_2$ and a spin on glass (SOG).

8. A method for removing a patterned multilevel resist according to claim 1, wherein the resin layer comprises one of a novolak resin, methacrylic resin and styrene derivative resin.

9. A method for removing patterned multilevel resist according to claim 1, wherein the halogen containing gas contains one of $F_2$, $CF_4$, $CF_3$, $C_2F_6$, $Cl_2$, $CCl_4$, $Br_2$, $NF_3$ and HBr.

10. A method for removing a patterned multilevel resist according to claim 1, wherein the surface layer of the substrate comprises one of silicon oxide, a phosphosilicate glass (PSG) film, a borophosphosilicate glass (BPSG) film, silicon nitride, polycrystalline silicon, single crystalline silicon, tungsten, and tungsten silicide.

11. A method for removing a patterned multilevel resist according to claim 1, wherein said method for removing a patterned multilevel resist is carried out when the patterned multilevel resist is defective.

12. A method for removing a patterned multilevel resist according to claim 1, wherein said method for removing a patterned multilevel resist is carried out after the surface layer of the substrate is etched by an etching process using the patterned multilevel resist.

13. A method for processing a patterned multilevel resist including a lower resist layer and an upper resist layer formed on the lower resist layer, comprising the steps of:
    forming a resin layer on the lower resist layer and on a surface exposed by the patterned multilevel resist;
    etching the resin layer and the patterned multilevel resist by a first dry etching process using halogen containing gas until the upper resist layer is removed; and
    etching the resin layer and the patterned multilevel resist remaining after the first dry etching process, by a second dry etching process using oxygen containing gas.

14. A method according to claim 13, wherein said second dry etching process is a plasma etching process using oxygen containing gas.

15. A method according to claim 13, wherein the halogen containing gas contains one of $F_2$, $CF_4$, $CF_3$, $C_2F_6$, $Cl_2$, $CCl_4$, $Br_2$, $Nf_3$ and HBr.

* * * * *

UNITED STATES PATENT AND TRADEMARK OFFICE
CERTIFICATE OF CORRECTION

PATENT NO.    : 5,160,404
DATED         : NOVEMBER 3, 1992
INVENTOR(S)   : TAKUSHI MOTOYAMA

It is certified that error appears in the above-identified patent and that said Letters Patent is hereby corrected as shown below:

Col. 1,   line 8,    "The invention" should be --The present invention--;
          line 60,   "method This" should be --method. This--.

Col. 3,   line 32,   "2(a)" should be --FIGS. 2(a)--; and
          line 32,   "1(d)," should be --2(d),--.

Col. 5,   line 44,   "said" should be --the--.

Col. 6,   line 60,   "Nf$_3$" should be --NF$_3$--.

Signed and Sealed this

Twelfth Day of October, 1993

Attest:

BRUCE LEHMAN

Attesting Officer

Commissioner of Patents and Trademarks